(12) United States Patent  
Kato

(10) Patent No.: US 7,463,031 B2
(45) Date of Patent: Dec. 9, 2008

(54) MRI APPARATUS AND RF COIL ASSEMBLY UTILIZED THEREIN

(75) Inventor: Yutaka Kato, Tochigi-ken (JP)

(73) Assignees: Kabushiki Kaisha Toshiba, Tokyo (JP); Toshiba Medical Systems Corporation, Otawara-shi (JP)

( * ) Notice: Subject to any disclaimer, the term of this patent is extended or adjusted under 35 U.S.C. 154(b) by 0 days.

(21) Appl. No.: 11/864,345

(22) Filed: Sep. 28, 2007

(65) Prior Publication Data

US 2008/0136412 A1 Jun. 12, 2008

(30) Foreign Application Priority Data

Sep. 28, 2006 (JP) .............................. P2006-264453

(51) Int. Cl.
*G01V 3/00* (2006.01)

(52) U.S. Cl. ..................................... 324/318; 324/322
(58) Field of Classification Search ......... 324/300–322; 600/407–422

See application file for complete search history.

(56) References Cited

U.S. PATENT DOCUMENTS

| | | | |
|---|---|---|---|
| 4,897,604 A * | 1/1990 | Carlson et al. ............... | 324/318 |
| 5,085,219 A | 2/1992 | Ortendahl et al. | |
| 5,150,710 A * | 9/1992 | Hall et al. ................... | 600/422 |
| 5,261,403 A * | 11/1993 | Saito et al. .................. | 600/422 |
| 5,465,719 A * | 11/1995 | Itagaki et al. ............... | 600/410 |
| 5,594,339 A * | 1/1997 | Henderson et al. .......... | 324/318 |
| 5,606,259 A * | 2/1997 | Potthast et al. .............. | 324/318 |
| 6,169,400 B1 * | 1/2001 | Sakuma ....................... | 324/318 |
| 6,693,428 B2 * | 2/2004 | Udo et al. .................... | 324/318 |
| 6,784,665 B1 * | 8/2004 | Chan et al. ................... | 324/318 |
| 7,109,713 B2 * | 9/2006 | Okamoto et al. ............ | 324/318 |
| 7,218,106 B2 * | 5/2007 | Yasuhara et al. ............ | 324/307 |
| 2007/0035301 A1 | 2/2007 | Nakabayashi et al. | |

FOREIGN PATENT DOCUMENTS

JP 4295337 10/1992

* cited by examiner

*Primary Examiner*—Brij B Shrivastav
(74) *Attorney, Agent, or Firm*—Oblon, Spivak, McClelland, Maier & Neustadt, P.C.

(57) ABSTRACT

An MRI apparatus includes a flexible upper RF coil unit having a plurality of coils which irradiate RF pulses or detect MR signals to or from an object, and a supporting unit configured to rotatably hold the RF coil unit at an upper end portion of the supporting unit, the coil unit supporting unit having a prescribed height so that the RF coil unit is placed at a position closely apart from the object. A lower portion of the supporting unit can be inserted in a guiding groove provided on an edge portion of the top plate. An upper portion of the supporting unit includes a rotatable joint member configured to rotatably hold one edge of the upper RF coil unit and a supporting arm extended from the rotatable joint member so as to support a lower surface of an edge portion of the upper RF coil.

20 Claims, 10 Drawing Sheets

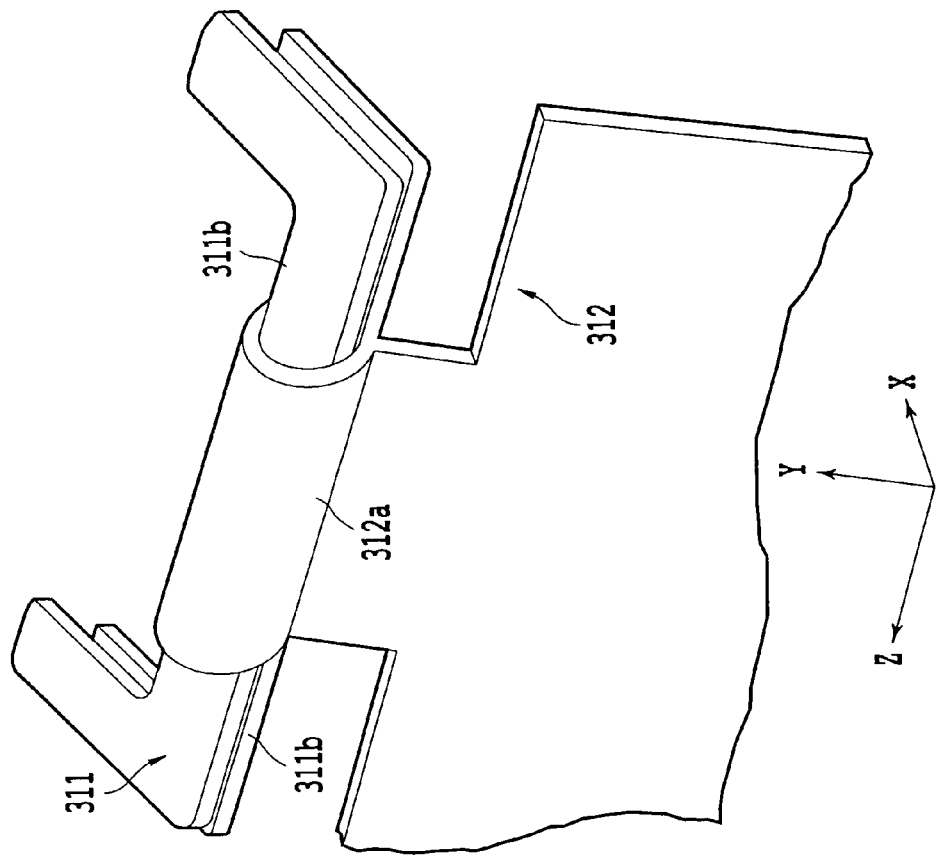
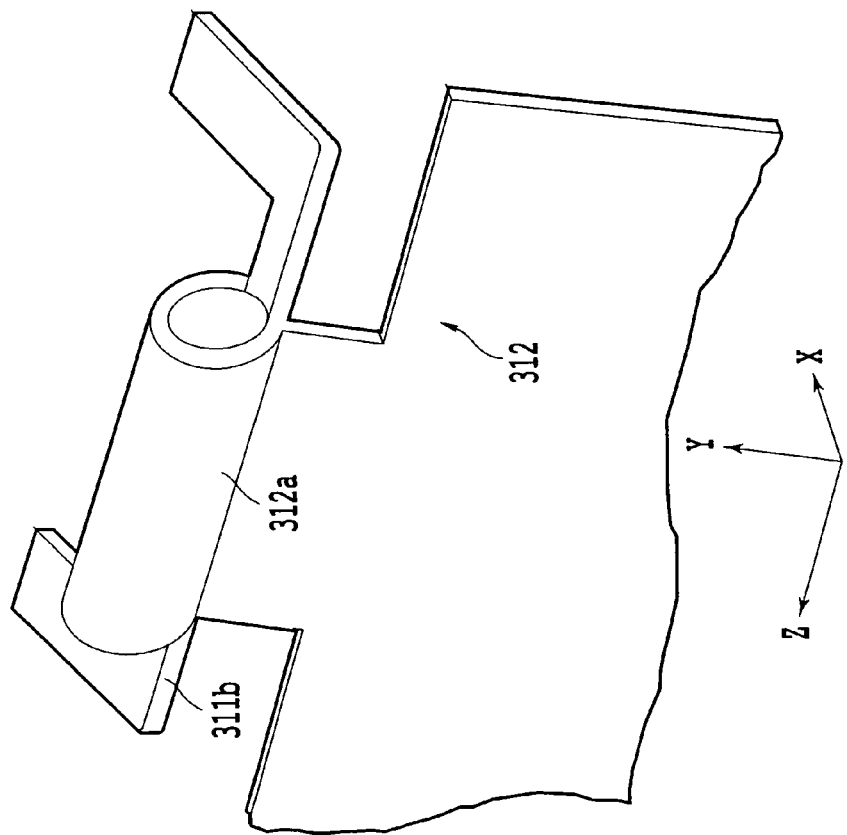

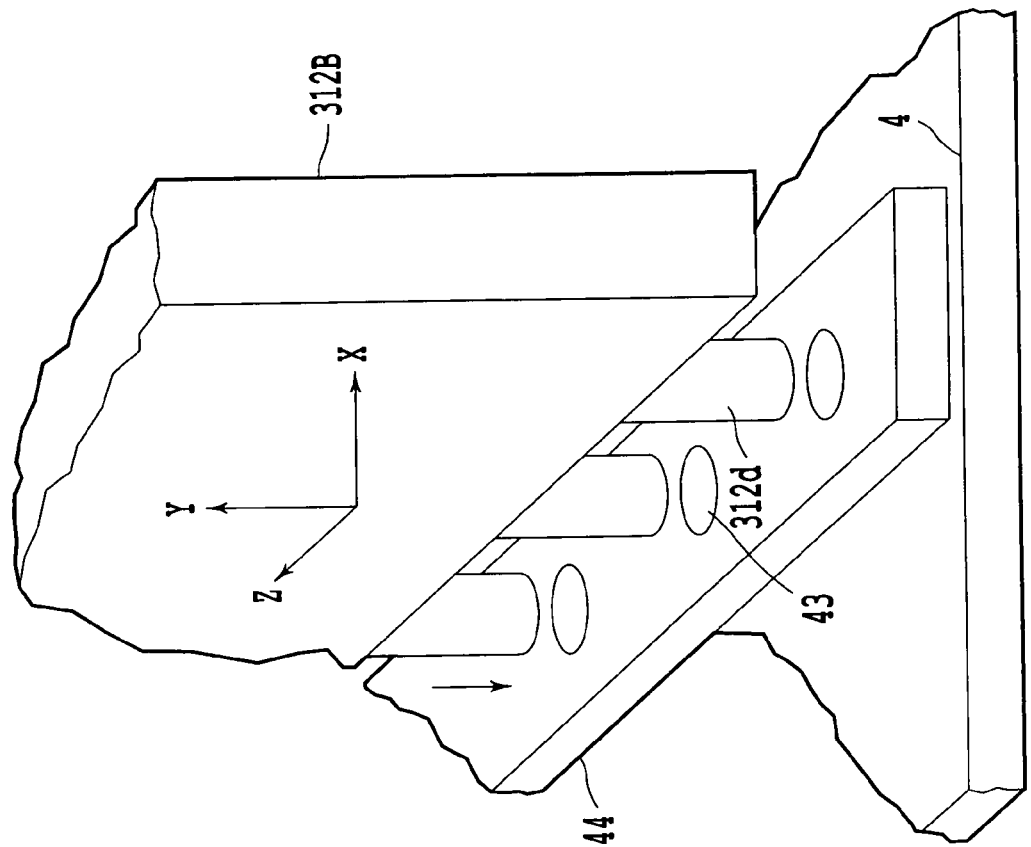
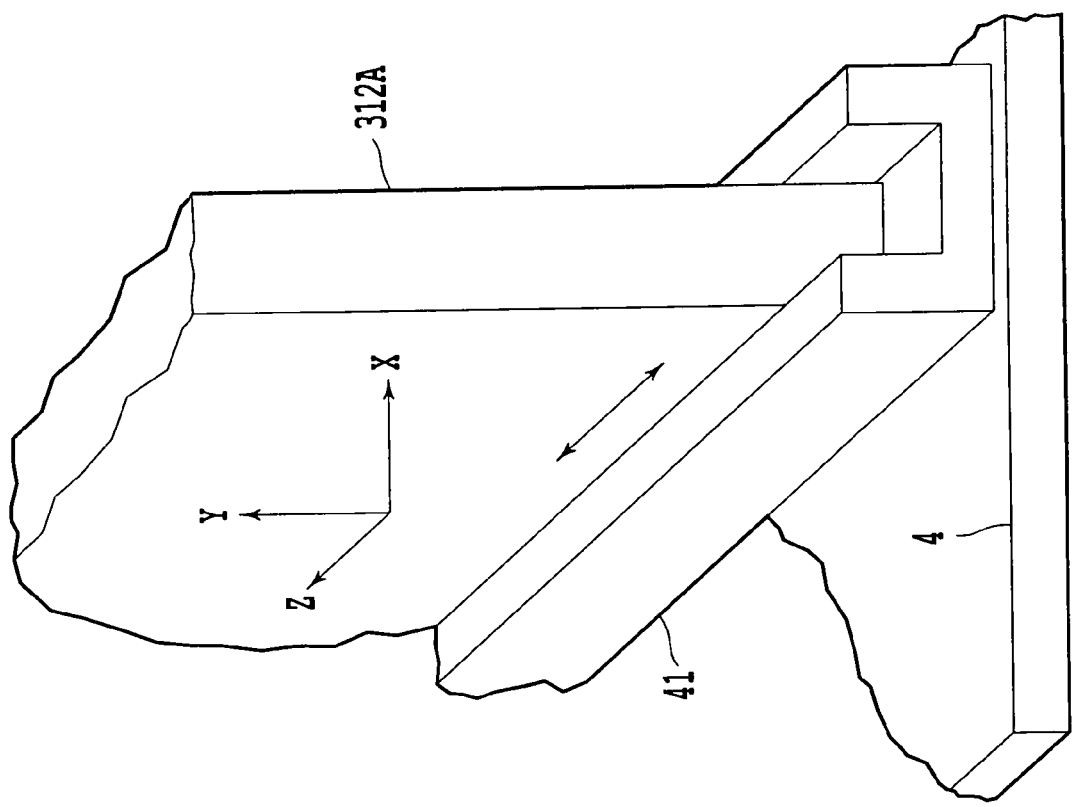
Fig. 7A
Fig. 7B

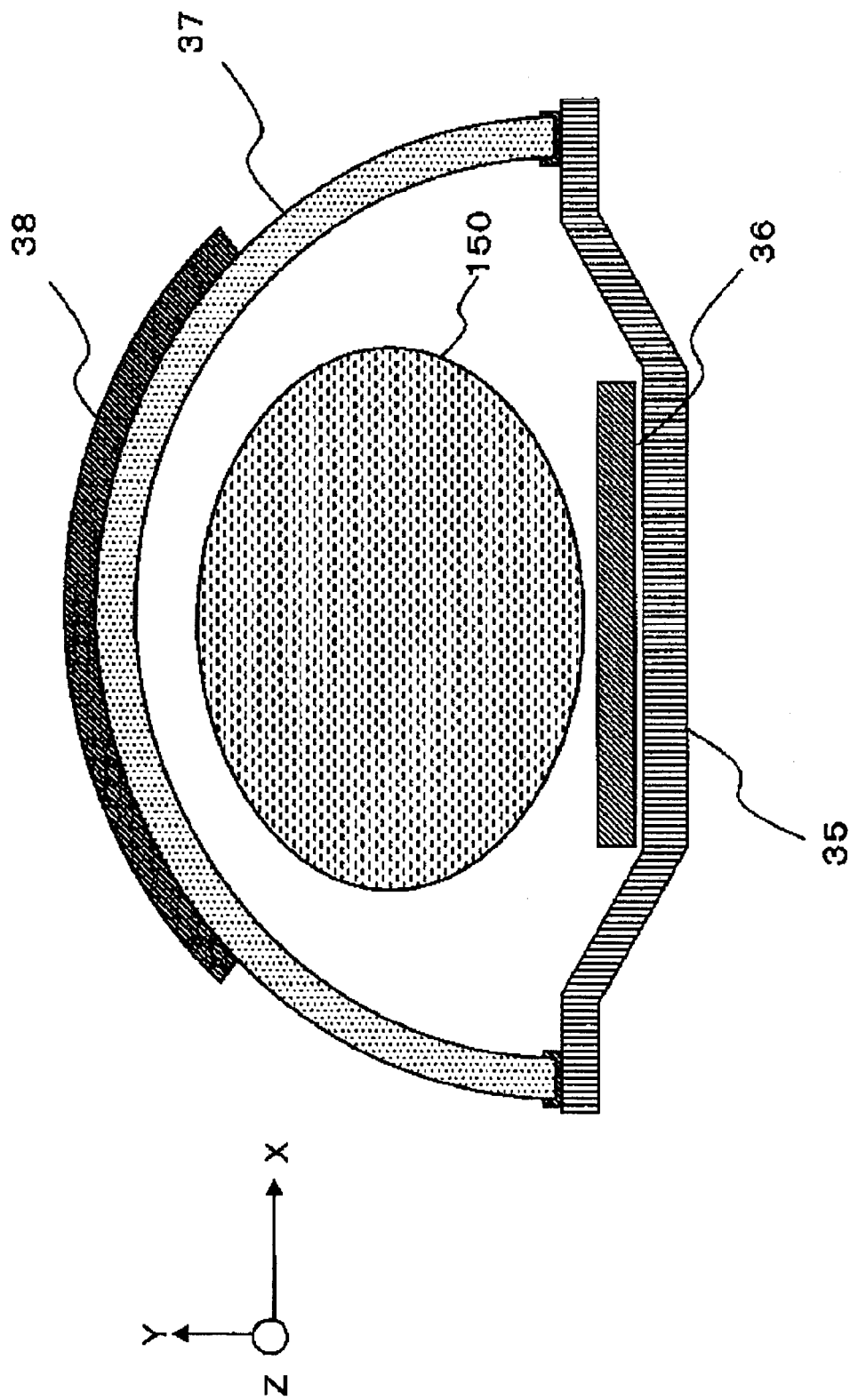
FIG. 10 (INTERNAL BACKGROUND ART)

MRI APPARATUS AND RF COIL ASSEMBLY UTILIZED THEREIN

CROSS-REFERENCE TO RELATED APPLICATIONS

This application claims the benefit of priority from Japanese Patent Application No. 2006-264453, filed on Sep. 28, 2006, the contents of which are incorporated by reference herein in their entirety.

BACKGROUND OF THE INVENTION

1. Field of the Invention

The present invention relates to a magnetic resonance imaging (MRI) apparatus and a radio frequency (RF) coil assembly utilized therein, and more particularly, to an RF coil assembly for an MRI apparatus that can quickly and easily position an upper RF coil unit at a close and prescribed distance apart from an object.

2. Background of the Invention

An MRI apparatus is an image diagnosis apparatus that can magnetically excite nuclear spins of an object placed in a static magnetic field by applying radio frequency signals (RF pulses) having the Larmor frequency and that can reconstruct image data based on the magnetic resonance (MR) signals induced in accordance with the excitation. Since an MRI apparatus can acquire various diagnosis data, such as, diagnostic anatomy data, diagnostic biochemistry data and diagnostic function data, it is now inevitably used in various image diagnosis fields.

It is required for an MRI apparatus to detect MR signals acquired from a living body in order to generate image data. MR signals are detected through a radio frequency coil unit (hereinafter simply referred to as an "RF coil unit") provided in the MRI apparatus. Generally, the RF coil unit includes a transmitting RF coil for exciting nuclear spins of diagnostic portion of an object by irradiations of RF pulses, and a receiving RF coil for detecting the MR signals from the excited nuclear spins. Of course, it is possible to irradiate (i.e., transmit) RF pulses and detect (i.e., receive) MR signals through the same RF coil unit, since an excitation timing of RF pulses differs from a detection timing of MR signals timing.

To reconstruct image data of good quality in an MRI apparatus, it necessary to detect weak MR signals acquired from a living body at high sensitivity. Accordingly, it is desired to place an RF coil unit as close as possible to a diagnostic portion of an object in order to effectively detect MR signals.

Conventionally, in an MRI apparatus for performing radiography of a whole body of an object, a whole body surface of the object is covered with a flexible RF coil unit so as to directly attach to the body surface in order to detect weak MR signals with high sensitivity. However, the conventional method has a problem that an object receives an oppressive sense of isolation, since the whole body of the object is covered by the RF coil unit. In particular, an object may be psychologically stressed when a phased array coil is utilized, since the phased array coil is formed of a plurality of RF coil units arranged in a body axis direction of the object and a total weight of the plurality of RF coil units is large.

To reduce or avoid such discomfort for an object, a method has been proposed, for example in a Japanese Patent Application Publication 7-100123, for maintaining flexible RF coils at a predetermined distance from a facing body surface of an object using a coil unit supporting unit.

FIG. 10 illustrate an internal background art for the applicant of the present invention in which an upper RF coil unit is placed on an object by using a supporting member for the upper RF coil assembly. Firstly, an operator adjusts a position of an object 150 so that a diagnostic portion of the object is located on a lower RF coil unit 36 fixed to a plate 35. After adjusting a position on the lower RF coil unit, a coil unit supporting member 37 of a cylindrical configuration is placed so as to cover the object 150. Further, a flexible upper RF coil unit 38 is placed so as to cover an upper surface of the cylindrical coil unit supporting unit 37. Then, the operator performs adjusting operations so that a whole surface of the upper RF coil unit 38 is faced opposite a whole surface of the lower RF coil unit 36. When both the coil unit supporting unit 37 and the upper RF coil unit 38 are placed so as to surround the object 150, a top plate 35 is moved along a body axis (i.e., z-axis) direction of the object 150 and is positioned in a radiography field (i.e., field of view (FOV)) formed in a gantry (not shown) for the MRI apparatus. By using the upper RF coil unit 38 placed over the object 150 and the lower RF coil unit 36 placed under the object 150, MRI radiography (imaging) is performed.

In the example shown in FIG. 10, the coil unit supporting unit 37 and the upper RF coil assembly 38 are independently constructed. Thus, two step operations are needed to place the upper RF coil unit 38 over the object 150 so as to cover a diagnostic portion of the object 150. A first step is to attach a coil unit supporting unit 37 over an upper surface of the diagnostic portion of the object 150, and a second step is to provide the upper RF coil unit 38 onto an upper surface of the coil unit supporting unit 37. Consequently, this method takes much more time and labor for placing the upper RF coil unit 38. To overcome this problem, it will be considered to construct an upper RF coil unit 38 and a coil unit supporting unit 37 as a unified body. However, such a unified body undesirably needs a larger storing space to pack it.

SUMMARY OF THE INVENTION

Accordingly, the present invention is provided to address the above-mentioned problems and defects of the conventional RF coil assembly utilizing an MRI apparatus, and to that end provides a novel RF coil assembly applicable to an MRI apparatus that can reduce or eliminate psychological stress afforded to an object and that can easily place an upper RF coil unit so as quickly to place as close as possible a lower RF coil unit at a desired diagnostic portion of an object. Further, the present invention provides a novel RF coil assembly that can easily pack the RF coil assembly in a compact size when MRI radiography operation has been completed.

According to one aspect of the present invention, there is provided an RF coil assembly for use in an MRI apparatus, including a flexible upper RF coil unit including a plurality of coils configured to irradiate RF pulses or to detect MR signals to and from an object supported on a top plate; and a coil unit supporting unit configured to hold the flexible upper RF coil unit at a prescribed upper position along a vertical Y-axis from the top plate, the coil unit supporting unit including a coupling member provided at an upper edge portion of the coil unit supporting unit and rotatably coupled with the flexible upper RF coil unit to place the flexible upper RF coil unit at a prescribed position apart from the object in the Y-axis direction.

According to another aspect of the present invention, a pair of coil unit supporting units of the above described RF coil assembly are provided and each includes a lower edge portion in the Y-axis direction placed in a guiding groove provided at each of edge portions of the top plate along an X-axis direction orthogonal to the Y-axis direction so as to be slidable therein, whereby the flexible upper coil unit may be supported on the top plate with a certain curvature along the object by fixing both edge portions of the flexible upper coil unit in the X-axis direction through both of the coil unit supporting units placed in the grooves. The RF coil assembly further includes a coupling member configured to be rotatably coupled to the orthogonal edge portion of the upper RF coil unit; and a supporting arm member configured to support the edge of the upper RF coil unit; whereby the upper RF coil unit is supported at a close to and apart prescribed distance from the object.

According to another aspect of the present invention, there is provided an RF coil assembly for an MRI apparatus, including a plurality of continuously coupled flexible upper RF coil assemblies coupled in a Z-axis direction parallel to an axis of an object to be imaged, each flexible upper RF coil assembly including a flexible RF coil unit including a plurality of coils for irradiating RF pulses or for detecting MR signals to and from an object, the plurality of coils having overlapping edge portions of adjoining coils in an X-axis direction orthogonal to the Z-axis direction, wherein the plurality of flexible upper RF coil assemblies are arranged so that a first overlapping area formed by the overlapped edge portions of the adjoining coils of the flexible RF coil unit in the X-axis direction and a second overlapping area formed by the overlapped edge portions of the adjoining coils in each of the adjoining flexible RF coil units of the respective upper RF coil assemblies in the X-axis direction have an equal overlap area size.

According to a further aspect of the present invention, there is provided a flexible upper RF coil unit in an RF coil assembly for an MRI apparatus in which the flexible upper RF coil unit is supported at a prescribed position closely apart from an object in a vertical Y-axis direction, including a plurality of RF coils for irradiating RF pulses or detecting MR signals to or from an object; and a coil cover containing the plurality of RF coils and having edge portions configured for connection to a rotatable coupling portion provided at one end in a vertical Y-axis direction of a coil unit supporting unit.

According to another aspect of the present invention, there is provided a RF coil unit supporting unit in an RF coil assembly for an MRI apparatus and which is configured to support a flexible upper RF coil unit at a prescribed position closely apart from an object in a vertical Y-axis direction, the RF coil unit supporting unit including an upper end portion having a coupling member provided at upper end in the Y-axis direction and configured to rotatably couple the RF coil unit; and the supporting unit having a prescribed height in the Y-axis direction so as that the flexible upper RF coil unit is positioned at a prescribed position closely apart from an object.

According to another aspect of the present invention, there is provided an MRI apparatus for generating MRI image data by detecting RF signals due to irradiation of RF pulses onto an object placed in a composite field of a static magnetic field and a gradient magnetic field, including a flexible upper RF coil unit including a plurality of coils configured to irradiate RF pulses or to detect MR signals to or from an object; and a coil unit supporting unit configured to rotatably hold the flexible upper RF coil unit at an upper end portion in a vertical Y-axis direction of the coil unit supporting unit, the coil unit supporting unit having a prescribed height in the Y-axis direction so that the flexible upper RF coil unit is placed at a position closely apart from the object in the Y axis direction.

BRIEF DESCRIPTION OF THE DRAWINGS

The accompanying drawings, which are incorporated in and constitute part of this specification, illustrate various embodiments and/or features of the present invention, and together with the description, serve to explain the present invention. Where possible, the same reference number will be used throughout the drawings to describe the same or like parts. In the drawings:

FIG. 4A is a perspective view illustrating a construction of a coil unit supporting unit for supporting an upper RF coil shown in FIG. 2.

FIG. 4B is a perspective view illustrating a construction of the coil unit supporting unit rotatably connected to the upper RF coil so as to form a unified body.

FIG. 7A is a perspective view of one embodiment for fixing a coil unit supporting unit to a top plate through a guiding groove.

FIG. 7B is a perspective view of another embodiment for fixing a coil unit supporting unit to a top plate through a plurality of insertion holes.

FIG. 10 is a cross-sectional view illustrating an internal background embodiment for placement of an upper RF coil.

DESCRIPTION OF THE PREFERRED EMBODIMENTS

Figure 1:
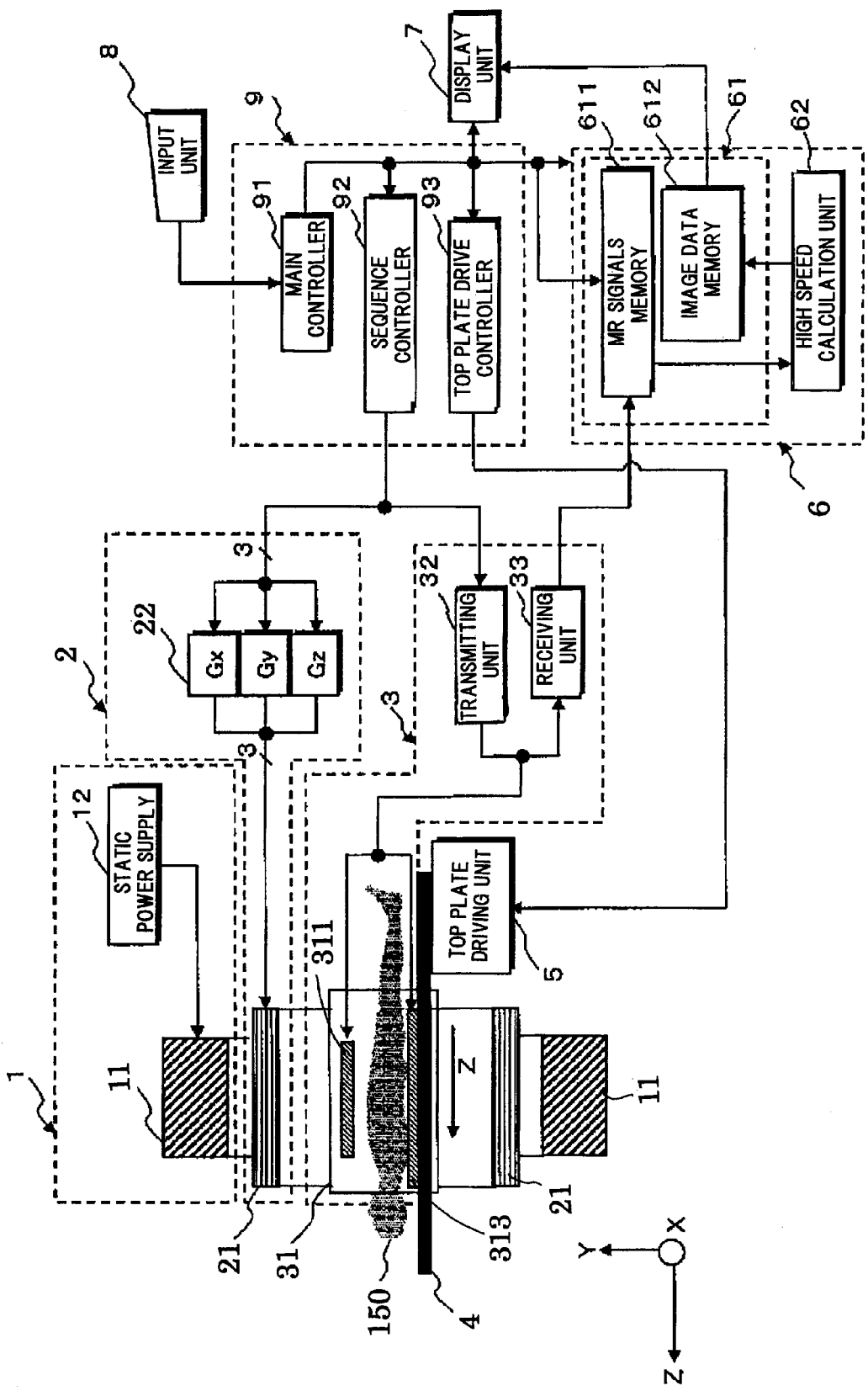
FIG. 1 is a block diagram illustrating construction of an embodiment of MRI apparatus consistent with the present invention.

As described hereinafter by reference to the drawings, an embodiment of an RF coil assembly utilizing an MRI apparatus according to the present invention includes an upper RF coil for irradiating RF pulses onto an object or for detecting MR signals, and a coil unit supporting unit for supporting and maintaining the upper RF coil over the object at an appropriate distance.

According to one embodiment of the present invention, an edge portion of the upper RF coil is rotatably joined to an edge portion of the coil unit supporting unit. An other edge portion of the coil unit supporting unit is detachably held by a supporting stand, such as a guiding groove, fixed on both edge portions of a lower RF coil that is placed between the top plate and the object. Hereinafter, it supposed that the RF coil used in the present embodiment functions both to irradiate RF pulses and to detect MR signals. Of course, it is possible to apply features of the present invention to an RF coil assembly functioning only to detect MR signals.

Referring not to the block diagram in FIG. 1, a construction of an MRI apparatus according to the present invention will be explained. MRI apparatus 200 includes a static magnetic field generating unit 1 for generating and applying magnetic field to an object 150, a gradient magnetic field generating unit 2, a transmission and/or reception unit 3 for irradiating RF pulses to the object 150 and for receiving MR signals, a top plate 4 for supporting the object 150 and a top plate moving mechanism unit 5 for moving the top plate 4 along a body axis (hereinafter referred to as "the Z-axis") of the object 150.

MRI apparatus 200 further includes an image data generating unit 6 for generating image data by performing reconstruction processes of MR signals received by the transmission/reception unit 3, a display unit 7 for displaying the generated image data, an input unit 8 for setting acquisition conditions of MR signals, for setting display conditions for the image data and for performing input operations of various command signals, and a control unit 9 for controlling operations of the respective units in the MRI apparatus 200.

The static magnetic field generating unit 1 forms a strong static magnetic field over an object 15 placed in a radiography field (i.e., field of view: (FOV)) in a gantry (not shown). The static magnetic field generating unit 1 includes a main magnet 11 formed of a conducting magnet or a superconducting magnet and a static magnetic field power source 2 for supplying currents to the main magnet 11. It is also possible to construct the main magnet 11 by a permanent magnet.

The gradient magnetic field generating unit 2 includes gradient magnetic field coils 21 for generating gradient magnetic fields Gx, Gy, Gz in each of orthogonal X-axis, Y-axis and Z-axis directions, and a gradient magnetic field power source 22 for supplying a pulse current to each of the gradient magnetic field coils 21. The gradient magnetic field power source 22 forms each of gradient magnetic fields Gx, Gy, Gz in the respective direction by controlling pulse currents supplied to each gradient magnetic field coil 21 respectively provided in the X-axis, Y-axis, and Z-axis directions based on sequence control signals.

By composing the respective gradient magnetic fields Gx, Gy, Gz, a slice selection gradient magnetic field Gs, a phase encode gradient magnetic field Ge and a reading (frequency encode) gradient magnetic field Gr are generated in desired orthogonal directions. The gradient magnetic field is impressed to the object 150 superposed with the static magnetic field formed through the main magnet 11.

The transmission/reception unit 3 includes an RF coil assembly 31 having an RF coil for irradiating RF pulses on the object 150 and for detecting MR signals from the object 150, a transmission unit 32 for supplying RF signals to the RF coil and a reception unit 33 for performing prescribed processing of MR signals detected through the RF coil. The transmission unit 32 generates and supplies a pulse current to both of an upper RF coil 311 and a lower RF coil 313 of the RF coil assembly 31. The pulse current is modulated by a prescribed selected excitation wave having a carrier of a magnetic resonance frequency (Larmor frequency) decided by the intensity of a static magnetic field of the main magnet 11, based on sequence control signals supplied from a sequence control unit 92 in a control unit 9 described hereinafter.

The upper RF coil 311 and the lower RF coil 313 in the RF coil assembly 31 detect weak MR signals. The detected weak MR signals are successively processed in an amplifier, an intermediate frequency converter, a phase detector, a filtering circuit and an A/D converter in the reception unit 34. Usually, the amplifier in the reception unit 34 is provided at a position near the RF coil assembly 31 in order to amplify MR signals detected through the upper RF coil 311 and the lower RF coil 313 at high S/N ratio.

The image data generating unit 6 includes a memory unit 61 and a high speed processing unit 62. The memory unit 61 includes an MR signal storage unit 611 for storing MR signals and an image data storage unit 611 for storing image data. In accordance with movement of the object 150, MR signals of N channels after converting to intermediate frequencies and detecting phases in the reception unit 34 are subjected to A/D conversion and successively stored in the MR signals storage unit 611. Imaging position data supplied from a main control unit 91 or a sequence control unit 92 in the control unit 9 are attached to these MR signals as affixed data.

The high speed processing unit 62 in the image data generating unit 6 reads MR signals stored in the MR signals storage unit 611 and the corresponding imaging position data and generates image data by performing image reconstructing processing including a two dimensional Fourier conversion. The image data acquired by the reconstructing process based on the MR signals and affixed imaging position data are stored in the image data storage unit 612.

Display unit 7 includes a display data generating circuit, a conversion circuit and a monitor. The display data generating circuit generates display data by composing image data supplied from the image data storage unit 612 in the image data generating unit 6 and affixed data of an object data supplied from the input unit 8 through the control unit 9. The conversion circuit in the display unit 7 generates image signal by performing a D/A conversion and a television format conversion of display data generated in the display data generating circuit after converting the display data to a prescribed display format and displays the display data on a monitor, for example, a cathode ray tube (CRT) or a liquid crystal (LCD) panel.

The input unit 8 includes various input devices, such as switches, a key board and a mouse, and a display panel on a console and performs input operation of an object data, setting of collecting conditions of MR signals, setting display conditions of image data, setting of moving speed of the top plate 4 and inputting of various command signals.

The control unit 9 includes a main control unit 91, a sequence control unit 92 and a top plate moving control unit 93. The main control unit 91 includes a central processing unit (CPU) and a storage circuit for controlling each unit in the MRI apparatus 10. A storage circuit in the main control unit 91 stores data such as object data inputted or set through the input unit 8, collecting conditions of MR signals, display conditions for image data and a moving speed of the top plate.

A CPU in the main control unit 91 generates pulse sequence data based on the data inputted through the data input unit 8, such as amount data of supplying pulse currents to the gradient magnetic field coil 21 or the RF coil assembly 31, a supplying time of the pulse current and data of supplying timing. The generated pulse sequence data is supplied to the sequence control unit 92. The sequence control unit 92 in the control unit 9 also includes a CPU and a storage circuit. The pulse sequence data supplied from the main control unit 91 is once stored in the storage circuit of the control unit 9. In accordance with the pulse sequence data, the sequence control unit 92 generates sequence control signals and controls a gradient magnetic field power supply 22 in the gradient magnetic field generating unit 2 and the transmission unit 32 in the transmission/reception unit 3. The top plate moving control unit 93 in the control unit 9 generates top plate moving control signals for moving the top plate 4 based on the pulse sequence data supplied from the main control unit 91 or the sequence control signals supplied from the sequence control unit 92. The generated top plate moving control signals are supplied to the top plate moving mechanism unit 5.

To perform MRI radiography, the main magnet 11 and the gradient magnetic field coil 21*a* form radiography fields at a center portion of a gantry (not shown) of MRI apparatus 200, and a diagnostic portion of the object 150 is placed in the radiography field by moving along the body axis direction, i.e., along the Z-axis direction, while supported surrounded by the upper RF coil 311 and the lower RF coil 313 of the RF coil assembly 31. The top plate 4 is mounted on an upper surface of a bed provided near to the gantry so as freely slide along a body axis direction of the object 150. By moving the object 150 placed on an upper surface of the top plate 4 in the Z-axis direction, the radiography portion of the object is placed in a desired radiography field.

The top plate driving unit 5 is provided on, for instance, a bed and moves the top plate 4 along the Z-axis direction at a prescribed speed by generating top plate driving signals based on top plate moving control signals supplied from a top plate moving control unit 93 in the control unit 9.

Figure 2:
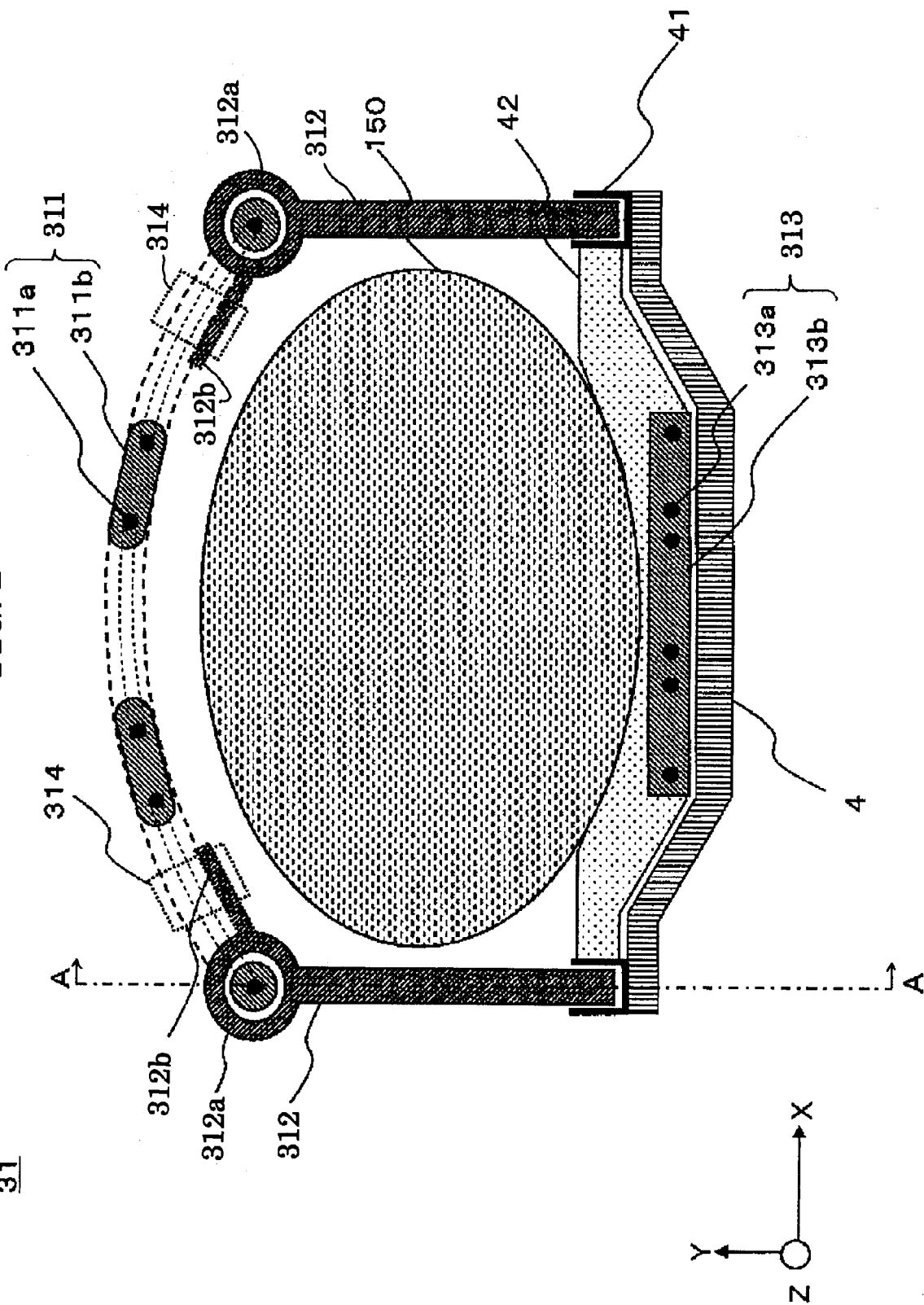
FIG. 2 is a cross-sectional view of the RF coil assembly used in the MRI apparatus shown in FIG. 1.

FIG. 2 is a cross-sectional view of the RF coil assembly 31 shown in FIG. 1 taken in an X-Y plane orthogonal to the Z-axis direction. RF coil assembly 31 includes an upper RF coil 311, and a coil unit supporting unit 312 for supporting the upper RF coil 311 at an appropriate position apart from the object.

The coil unit supporting unit 312 includes a coupling member 312a provided at an upper end portion of the coil unit supporting unit 312 in the Y-axis direction so as to rotatably hold a coupling edge portion of the flexible upper RF coil 311 in the X-axis direction, and a supporting arm member 312b fixed to the coupling member 312a configured to support the coupling edge portion of the upper coil unit 311 in the X-axis direction.

A lower end portion of each coil unit supporting unit 312 is, as will be explained later, mounted into a guiding groove or insertion hole provided at each edge portion of the top plate in the X-axis direction. Lower end portions of the coil unit supporting units 312 are placed in the grooves so as to slide the assembly at an appropriate position for MRI radiography.

The coil unit supporting unit 312 of the RF coil assembly 31 further includes a coil fixing member 314 configured to fix in the X-axis direction an edge portion of the upper RF coil unit 311 which contacts to the supporting arm member 312b.

The upper RF coil unit 311 is provided at a position that faces a lower RF coil unit 313 provided between the object 150 and the top plate 4, in order to irradiate RF pulses or to detect RF pulses to or from the object 150.

As explained above, an upper end portion of the coil unit supporting unit 312 includes a coupling member 312a rotatably connected to one edge portion of the upper RF coil unit 311 in the X-axis direction, and a supporting arm member 312b fixed to the coupling member 312a in order to support the lower surface of the connected edge portion of the upper RF coil unit 311. A lower end portion of the coil unit supporting unit 312 in the Y-axis direction is slidably mounted in a guiding groove provided an edge portion of the top plate 4 in the X-axis direction.

Since the supporting arm member 312b supports the lower surface of the connected edge portion of the upper RF coil unit 311, it becomes possible to fix the upper RF coil unit 311 on the top plate 4 by mounting a pair of coil unit supporting units 312 at opposite edge portions of the top plate in the X-axis direction so as that the flexible upper RF coil unit 311 has a curvature along a body surface of the object 150.

To place the flexible upper RF coil unit at a closely apart position of prescribed distance, it is possible to construct the supporting arm member 312b of the coil unit supporting unit 312 of an elastic configuration for expanding and contracting it so as to lift up and down the upper RF coil unit in accordance with a body size of the object.

Figure 3A:
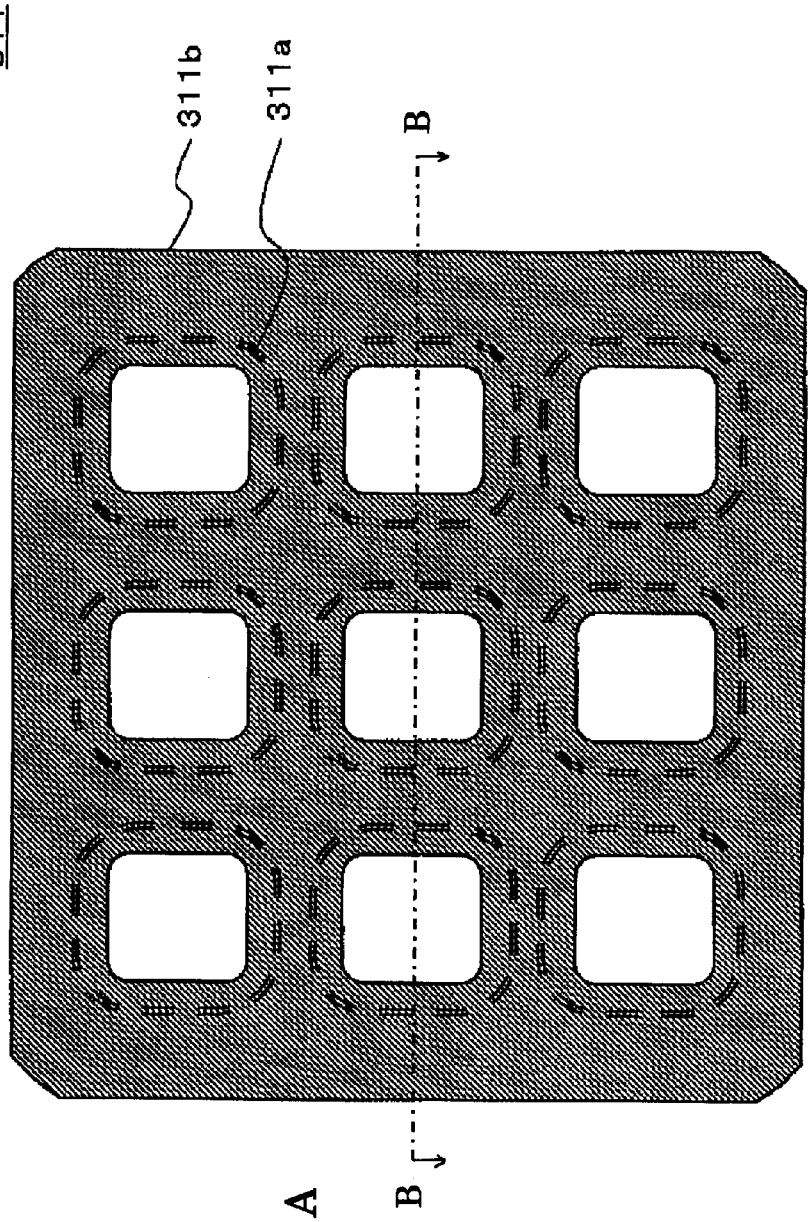
FIG. 3A is a plan view of an exemplary embodiment of the upper RF coil shown in FIG. 2.
Figure 3B:
FIG. 3B is a cross-sectional view of the upper RF coil taken along a line B-B shown in FIG. 3A.

FIG. 3A is a plan view illustrating an embodiment of an upper RF coil 311 shown in FIG. 2. FIG. 3B is a cross-sectional view of the upper RF coil 311 shown in FIG. 3A taken along a line B-B. As shown in FIG. 3A, the upper RF coil unit 311 includes a coil cover 311b made of a flexible resin and including a plurality of rectangular apertures 330 arranged in two-dimensional X-Z directions, and a plurality of loop-shaped coils 311a disposed so as to surround respective of the plurality of rectangular apertures 330.

As illustrated in FIG. 3B, each coil 311a is covered by the coil cover 311b made of a flexible resin. In the embodiment shown in FIG. 3A, the RF coil 311 includes three rectangular apertures arranged along each of an X-direction and a Z-direction.

Of course, the present invention is not limited to such number or arrangement of apertures. It is also possible to prepare the flexible resin coil cover 311b without apertures 330. In such a case, at least one loop-shaped coil 311a is provided in an X-Z plane. A plurality of loop-shaped coils 311a may be provided so as to form a plurality of concentric circles in the flexible resin coil cover 311b.

FIG. 4A schematically illustrates structure of the coil unit supporting unit 312 shown in FIG. 2. As shown in FIG. 4A, a cylindrical joint member 312a is fixed at an upper edge portion of the coil unit supporting unit 312 and a pair of L-shaped supporting arms 312b is attached at each edge portion of the cylindrical joint member 312a in a Z-direction. The cylindrical joint member 312a constructs a rotatable joint unit. Of course, it is possible to unify the rotatable joint member 312a and the supporting arm 312b to the coil unit supporting unit 312.

FIG. 4B illustrates an RF coil assembly in which the upper RF coil 311 is rotatably connected on a cylindrical coupling member 312a of the coil unit supporting unit as a unified configuration. As shown in FIG. 4B, one edge portion of the coil cover 311b that covers a coil 311a (as depicted in FIG. 3B) of the upper RF coil 311 rotatably penetrates the cylindrical coupling member 312a of the coil unit supporting unit 312.

Consequently, one edge of the upper RF coil 311 is rotatably held in the cylindrical coupling member 312a of the coil unit supporting unit 312. Further, the L-shaped support arm members 312b fixed at edges of the cylindrical coupling member 312a support lower surfaces of the edge portion of the upper RF coil 311.

Opposite edge portions of the upper RF coil unit 311 are respectively supported by a pair of the coil unit supporting unit 312 so that the upper RF coil 311 may be formed with a desired curvature in the X-axis direction along a body surface of the object 150, as depicted in FIG. 2.

Figure 5:
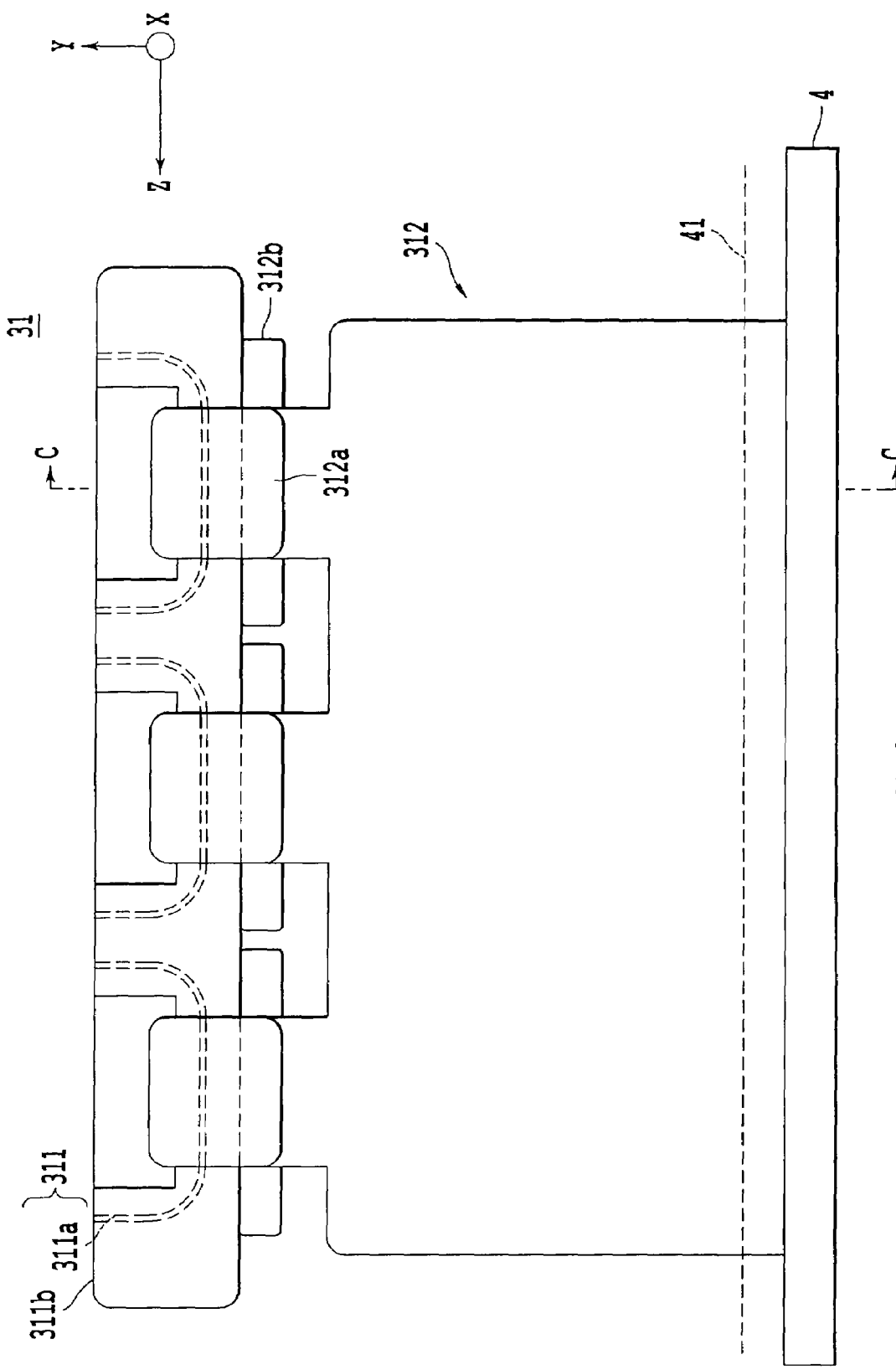
FIG. 5 is a side view of the upper RF coil and the coil unit supporting unit shown in FIG. 2.

FIG. 5 is a side view of the RF coil assembly 31 shown in FIG. 2. As explained in FIG. 4B, an edge portion of upper RF coil 311 is rotatably mounted on a coil unit supporting unit 312 through a cylindrical joint member 312a and a pair of supporting arms 312b that are provided at edges of the coil unit supporting unit 312. The lower edge portion of the coil unit supporting unit 312 is inserted into a guiding groove 41 provided on the top plate 4.

Figure 6:
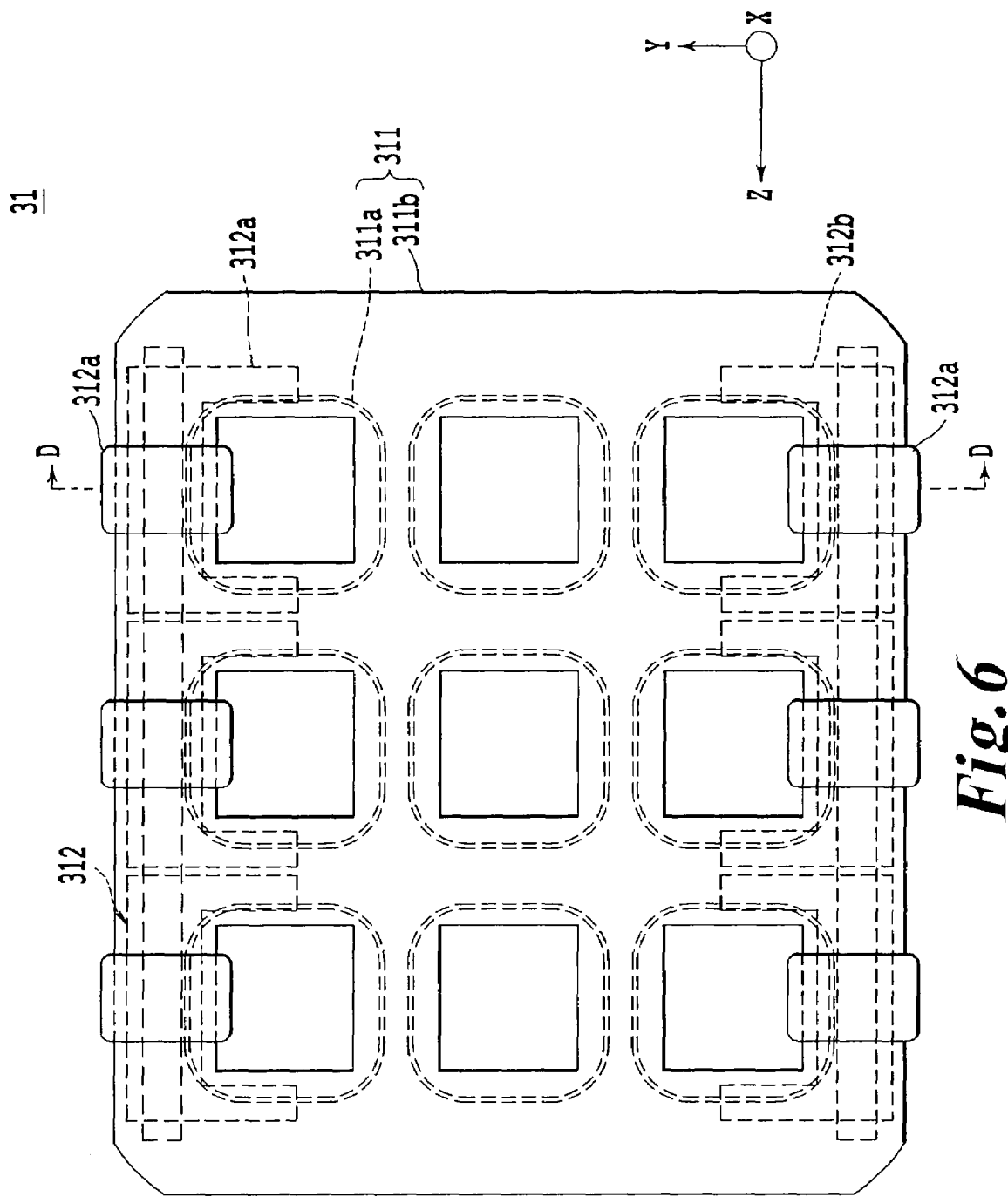
FIG. 6 is a plan view of the upper RF coil and the coil unit supporting unit in the embodiment shown in FIG. 1.

To form the upper RF coil 311 into a desired curvature along a body surface of an object 150 as depicted in FIG. 2, a plurality coils 311a of RF coil 311 are used. As illustrated in FIG. 6, opposite edge portions of the RF coil 311 along the X-axis direction are rotatably mounted through respective units 312 each having a cylindrical joint member 312a and a supporting arm 312b.

By coupling a plurality of RF coils 311a with respective units 312, the upper RF coil 311 is formed so as to have a desired curvature. A cross-sectional view being taken along a line C-C in FIG. 5 and a cross-sectional view being cut along a line D-D in FIG. 6 respectively correspond to the cross-sectional view of RF coil assembly 31 depicted in FIG. 2.

FIG. 7A illustrates structure of the lower end portion of the coil unit supporting unit 312. As shown in FIG. 7A, the coil unit supporting unit 312 is mounted on the top plate by inserting the lower end portion of the coil unit supporting unit 312 in the Y-axis direction into a guiding groove provided in the Z-axis direction at an edge portion of the top plate.

To easily perform positioning adjustment of the upper RF coil 311 so as to face a lower RF coil 313 provided between the top plate 4 and an object 150, the lower end portion of the coil unit supporting unit 312 is slidably inserted into the groove 41.

FIG. 7B illustrates another embodiment for mounting a coil unit supporting unit 312 onto the top plate 4. A supporting stand 44 having a plurality of insertion apertures 43 arranged at a prescribed space interval in the Z-axis is provided on opposite edge portions of the top plate 4. The opposite coil unit supporting units 312 are mounted by using the plurality of insertion apertures 43 provided at opposite edge portions of the top plate 4.

FIG. 7B illustrated plural insertion legs 312d provided in relation to insertion holes 43. In this embodiment, one insertion leg 312d provided in relation to plural insertion holes 43 may suffice. Thus, at least one insertion leg 312d is provided at opposite supporting units 312 and each leg 312d is inserted into an appropriate one of the plurality of insertion holes 43 located at an equal interval in the Z-axis direction on the supporting plate 44. To place the upper RF coil 311 so as to face the lower RF coil unit 313, the at least one insertion leg 312d of each of the opposite coil supporting units 312 is inserted in an appropriate insertion hole 43 by selecting among the plurality of insertion holes.

Thus, the upper RF coil unit 311 is mounted facing the lower RF coil unit 313 by inserting the at least one insertion legs 312d into a selected appropriate insertion hole.

Figure 8:
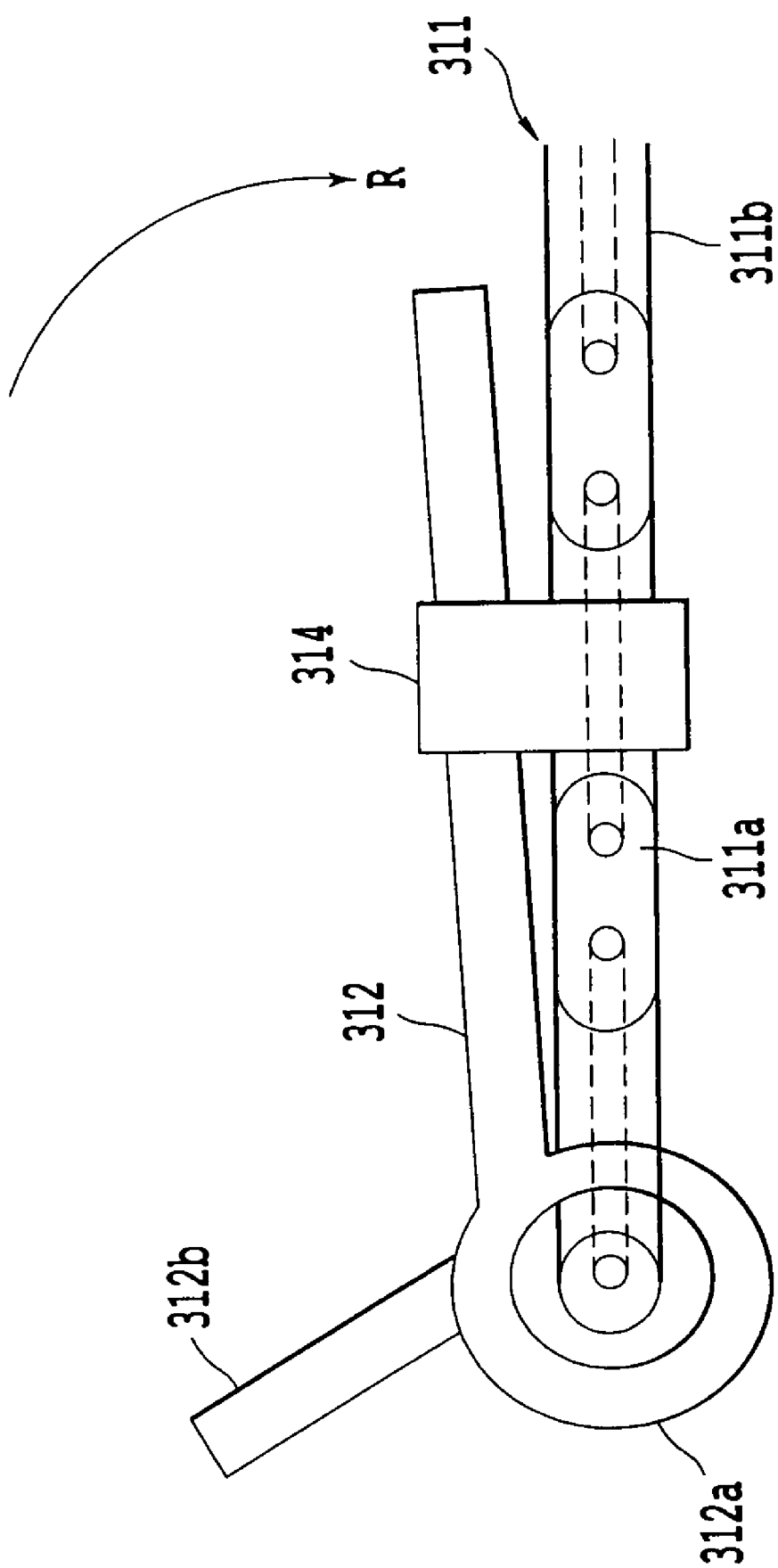
FIG. 8 is a side view illustrating the packing of an upper RF coil and a coil unit supporting unit consistent with the present invention.

FIG. 8 illustrates a method for packing the RF coil assembly 31 upon completion of an MRI radiography operation. In order to pack RF coil assembly 31, an operator releases the unit 312 from the groove 41 or insertion hole(s) and rotates the coil unit supporting unit 312 along an R-direction, i.e., outwardly in the view shown in FIG. 2, so that as shown in FIG. 8 the outer surface of the unit 312 rotated by means of the rotatable joint unit 312a as a rotation center comes into contact with the upper face of the coil cover 311b of the upper RF coil 311. To keep the contacting status, the coil unit supporting unit 312 and the coil cover 311b are fixed by a coil fixing member 314.

It is possible to bind the coil unit supporting unit 312 and the coil cover 311b by a fixing belt. Further, it is also possible to fix a surface fastener on a contacting surface of the coil unit supporting unit 312 and the coil cover 311b.

As the coil fixing member, it is possible to select one of a ring shaped fixing member, a fixing belt or a face fastener. The coil fixing member releases the edge portion of the upper RF coil unit in the X-direction when the RF coil assembly is packed in order to rotate the coil unit supporting unit 312 around the coupling member along the arrow R depicted in FIG. 8 toward an upper face of the coil unit 311. Then, the coil fixing member 314 fixes the upper RF coil unit 311 and the coil unit supporting member 312.

According to the embodiment of an MRI apparatus and an RF coil assembly utilizing for the MRI apparatus consistent with the present invention, an upper RF coil for irradiating RF pulses and for detecting MR signals to and from an object and a coil unit supporting unit for supporting the upper RF coil are constructed as an unified body through a rotatable joint member. Accordingly, it becomes possible to easily and quickly set the upper RF coil at a starting time of radiography and also possible to easily pack the RF coil assembly upon completion of operation of radiography. Consequently, it can reduce burdens of an operator during MRI radiography and inspection efficiencies can be improved while avoiding psychological stress to an object.

According to an embodiment of an RF coil assembly utilizing for an MRI apparatus consistent with the present invention, a lower portion of a coil unit supporting unit is slidably disposed in a guiding groove provided on a top plate. Consequently, it becomes possible to easily and quickly set the upper RF coil at a position facing a lower RF coil or an object. Since an edge portion of the upper RF coil of the RF coil assembly consistent with the present invention is supported by a supporting arm of a coil unit supporting unit, it becomes possible to easily place the upper RF coil with an appropriate curvature along a body surface of an object. Further it becomes possible to safely and more accurately place the upper RF coil by fixing an edge portion of the upper RF coil to the supporting arm through a coil fixing member.

In an RF coil assembly for an MRI apparatus consistent with the present invention, a plurality of rotatable joint members of a coil unit supporting unit is rotatably coupled to each of a plurality of edge portions of a plurality of upper RF coils. Consequently, it becomes possible to store the RF coil assembly in a small packing space by folding up the plurality of upper RF coils upon completion of MRI radiography. Further, it is also possible to safely carry the upper RF coil and a coil unit supporting unit by packing an edge portion of the upper RF coil and a supporting arm through a coil fixing member.

The present invention is not limited to the above described embodiments, as various modifications are possible. For example, the RF coil assembly 31 explained in the embodiment has both functions for irradiating RF pulses to an object and for detecting MR signals from the object. The features of the present invention can also be used for a RF coil assembly having only an MR signal detecting function. In this case, it necessary to separately provide a transmission RF coil for irradiating RF pulses in a gantry of an MRI apparatus.

As explained the above, the number and arrangement of a plurality of apertures provided in an upper RF coil are not limited to the embodiment. It is also possible to construct the upper RF coil without providing apertures and/or with one or more rectangular coils or loop shaped coils arranged in an X-Z plane. Of course, the present invention may utilize an RF coil for an exclusive use corresponding to a particular diagnostic object portion, such as a head portion, a neck portion, shoulder portions, and knee portions.

Figure 9:
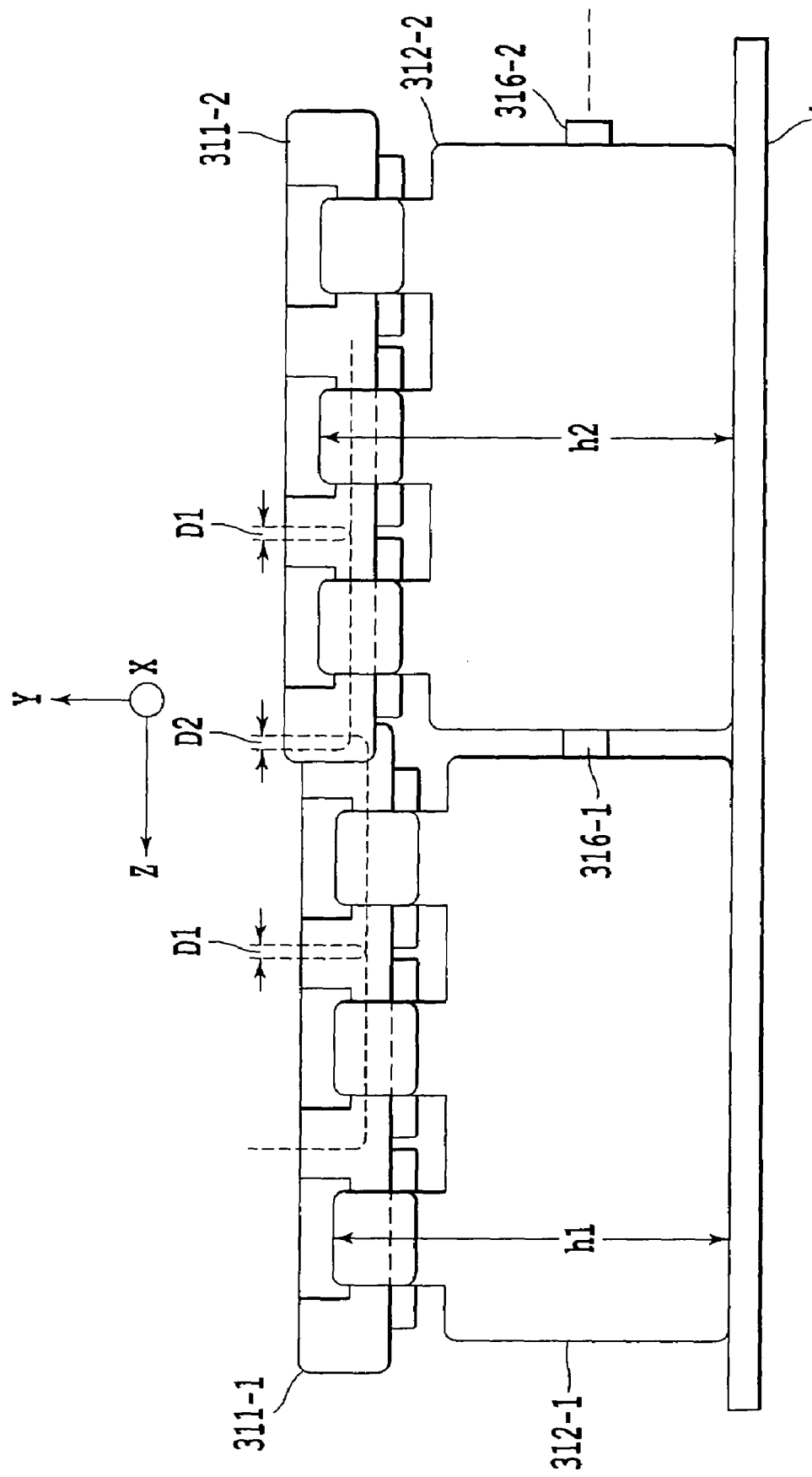
FIG. 9 is a side view illustrating a modification of an upper RF coil consistent with the present invention.

FIG. 9 illustrates a modification in which a plurality of upper RF coils 311-1, 311-2 is arranged. To simplify the explanation, only two upper RF coils are depicted. Thus a first upper RF assembly 311-1 and a second upper RF assembly 311-2 are arranged in the Z-direction. The first upper RF coil 311-1 is placed at a prescribed position by the coil unit supporting unit 312-1 of a first height h1 in the Y-axis direction. The second upper RF coil 311-1 is placed at a different predetermined position by a coil unit supporting unit 312-2 having a second height h2 that is different from the first h1. Thus, h1 ≠h2.

According to this configuration, adjoining edge portions of the first upper RF coil 311-1 and the second upper RF coil 311-2 in the Z-axis direction can be overlapped as shown in FIG. 9.

Thus, an imaging area (i.e. a field of view (FOV)) is constructed on the overlapped edge portions between the first and second upper RF coil unit. Each of the first and the second coil unit supporting units includes a first and a second stopper 316-1 and 316-2 so as to define a space between the adjoining two supporting units 312-1 and 312-2 in the Z-axis direction in order to overlap the adjoining edge portions of the two upper RF coil units. By providing the stopper between the adjoining edge portions of the two coil unit supporting units, it is possible easily and accurately to arrange the two upper RF coil units with an overlapped area between them.

In this case, it is important to form a first overlapping coil area D1 by overlapping adjoining two edge portions of the loop shaped coils in the Z-axis direction in each of the upper RF coil units. On the other hand, a second overlapping coil area D2 is formed between the two adjoining upper RF coil units in the Z-axis direction by the respectively adjoining coil edges in each of the coil edge portions in each of the first and the second upper RF units in the Z-axis direction.

A first stopper 316-1 is provided between the first and the second coil unit supporting units 312-1 and 312-1 so that the second overlapping coil area D2 formed between the adjoining edge portion of the coils in the respective upper RF coils has an overlapping coil area equal to the first overlapping coil area D1 in the Z-axis direction. Thus, the second overlapping coils area D2 is defined by the width of the stopper 316-1 in the Z-axis direction.

As shown in FIG. 9, a connected assembly is constructed by a plurality of flexible upper RF coil assemblies so that edge portions of the adjoining coils in the respective upper RF coil units in the Z-axis direction form a first overlapping coil area D1. And a continuously coupled configuration of two adjoining flexible upper RF coil assemblies coupled in the Z-axis direction forms a second overlapping coil area D2. The plurality of connected flexible upper RF coil assemblies is continuously connected through a stopper in the Z-axis direction so that the second overlapping coil area D2 becomes equal to the first overlapping coil area D1

Other embodiments consistent with the present invention will be apparent to those skilled in the art from consideration of the specification and practice of the present invention disclosed herein. It is intended that the specification and examples be considered as exemplary only, with a true scope and spirit of the present invention being indicated by the following claims.

What is claimed is:
1. An RF coil assembly for an MRI apparatus, comprising:
a flexible upper RF coil unit including a plurality of coils configured to irradiate RF pulses or to detect MR signals to and from an object supported on a top plate; and
a coil unit supporting unit configured to hold the flexible upper RF coil unit at a prescribed upper position along a vertical Y-axis from the top plate,
the coil unit supporting unit including a coupling member provided at an upper edge portion of the coil unit supporting unit and rotatably coupled with the flexible upper RF coil unit to place the flexible upper RF coil unit at a prescribed position apart from the object in the Y-axis direction.

2. The RF coil unit assembly according to claim 1, wherein the flexible upper RF coil unit comprises:
a flexible coil cover member configured to cover the plurality of coils and including a plurality of apertures arranged at least along a Z-axis direction orthogonal to the Y-axis direction.

3. The RF coil unit assembly according to claim 1, wherein the coil unit supporting unit comprises:
a cylindrical coupling member configured to be rotatably coupled with an edge portion of the upper RF coil unit; and
a supporting arm member fixed to an edge portion of the cylindrical coupling member so as to support the edge portion of the upper RF coil unit.

4. The RF coil assembly according to claim 3, wherein:
the coil unit supporting unit comprises a pair of the supporting arm members fixed at each of opposite edge portions of the top plate along an X-axis direction orthogonal to the Y-axis and Z-axis directions so as to support opposite edge portions of the flexible upper RF coil unit in the X-axis direction; and
the flexible upper RF coil unit is placed so as to have a curved surface in the X-axis direction.

5. The RF coil assembly according to claim 3, wherein the supporting arm member of the coil unit supporting unit includes an elastic configuration for expanding and contracting so as to lift up and down the upper RF coil unit in accordance with a body size of the object in order to place the upper RF coil unit at a prescribed apart position from the object.

6. The RF coil assembly according to claim 3, further comprising:
an L-shaped supporting arm member fixed to the cylindrical coupling member of coil unit supporting unit; and
a coil fixing member configured to fix an L-shaped supporting arm member to the edge portion of the flexible upper RF coil unit.

7. The RF coil assembly according to claim 6, wherein the coil fixing member is constructed by one of a ring shaped fixing member, a fixing belt or a surface fastener, each having a contacting surface of a prescribed area.

8. The RF coil assembly according to claim 6, wherein the coil fixing member releases the edge portion of the flexible upper RF coil unit from the supporting arm member of the coil unit supporting unit when the RF coil assembly is packed, and again couples the coil unit supporting unit and the flexible upper RF coil unit after rotating the flexible upper RF coil unit round the cylindrical coupling member to an outer surface of the coil unit supporting unit.

9. The RF coil assembly utilizing for an MRI apparatus according to claim 1, wherein the top plate includes a guide groove extending provided in the X-axis direction at an edge portion of the top plate, and a lower edge portion in the Y-axis direction of the coil unit supporting unit is slidably mounted in the guide groove;
whereby the upper RF coil unit is positioned facing a lower RF coil unit provided between the top plate and the object.

10. The RF coil assembly according to claim 1, wherein a lower edge portion in the Y-axis direction of the coil unit supporting unit includes at least one insertion leg;
the top plate includes a plurality of insertion holes provided at an edge portion of the top plate;
the at least one insertion leg is inserted into at least one insertion hole among the plurality of insertion holes,
whereby a setting position of the flexible the upper RF coil unit is adjusted so as to face a lower RF coil unit provided between the top plate and the object by corresponding selection of the at least one insertion hole in which the at least one insertion peg is inserted.

11. An RF coil assembly for an MRI apparatus, comprising:
a plurality of continuously coupled flexible upper RF coil assemblies coupled in the Z-axis direction parallel to an axis of an object to be imaged, each flexible upper RF coil assembly comprising a flexible RF coil unit including a plurality of coils for irradiating RF pulses or for detecting MR signals to and from an object, the plurality of coils having overlapping edge portions of adjoining coils in an X-axis direction orthogonal to the Z-axis direction, the plurality of flexible upper RF coil assemblies arranged so that a first overlapping area formed by the overlapped edge portions of the adjoining coils of the flexible RF coil unit in the X-axis direction and a second overlapping area formed by the overlapped edge portions of the adjoining coils in each of the adjoining flexible RF coil units of the respective upper RF coil assemblies in the X-axis direction have an equal overlap area size.

12. The RF coil assembly according to claim 11, wherein each of the plurality of the coil unit supporting units has a different height in the Y-axis direction so that each of the plurality of the coil unit supporting units overlap at adjoining edge portions of the upper RF coil units in the Z-axis direction.

13. The RF coil assembly according to claim 11, wherein each of the plurality of the coil unit supporting units includes a stopper of a prescribed width in the Z-axis direction, the stopper defining an overlapping width of the adjoining RF coil units in the Z-axis direction so that a second coil overlapping area made by the adjoining RF coil units has a size equal to a first coil overlapping area made in the Z-axis direction by adjoining internal coils in one RF coil unit.

14. A flexible upper RF coil unit in an RF coil assembly for an MRI apparatus in which the flexible upper RF coil unit is supported at a prescribed position closely apart from an object in a vertical Y-axis direction, comprising:

a plurality of RF coils for irradiating RF pulses or detecting MR signals to or from an object; and a coil cover containing the plurality of RF coils and having edge portions configured for connection to a rotatable coupling portion provided at one end in a vertical Y-axis direction of a coil unit supporting unit.

15. The flexible upper RF coil unit according to claim 14, wherein:

the coil cover includes a plurality of apertures along at least a Z-axis direction orthogonal to the Y-axis direction; and each of the plurality of RF coils is arranged so as to surround respective of the apertures.

16. The flexible upper RF coil unit according to claim 14, wherein:

the plurality of RF coils are arranged so that at least adjoining edge portions of the RF coils are overlapped with a prescribed overlapping area.

17. An RF coil unit supporting unit in an RF coil assembly for an MRI apparatus and which is configured to support a flexible upper RF coil unit at a prescribed position closely apart from an object in a vertical Y-axis direction, the RF coil unit supporting unit including:

an upper end portion having a coupling member provided at upper end in the Y-axis direction and configured to rotatably couple the RF coil unit; and the supporting unit having a prescribed height in the Y-axis direction so that the flexible upper RF coil unit is positioned at a prescribed position closely apart from an object.

18. The RF coil unit supporting unit according to claim 17, comprising:

a lower end portion in the Y-axis direction for placement in a guide groove provided at each of edge portions of a top plate.

19. The RF coil unit supporting unit according to claim 17, comprising:

a lower end portion in the Y-axis direction including at least one insertion leg for placement in at least one insertion hole provided at each of edge portions of a top plate.

20. An MRI apparatus for generating MRI image data by detecting RF signals due to irradiation of RF pulses onto an object placed in a composite field of a static magnetic field and a gradient magnetic field, comprising:

a flexible upper RF coil unit including a plurality of coils configured to irradiate RF pulses or to detect MR signals to or from an object; and a coil unit supporting unit configured to rotatably hold the flexible upper RF coil unit at an upper end portion in a vertical Y-axis direction of the coil unit supporting unit, the coil unit supporting unit having a prescribed height in the Y-axis direction so that the flexible upper RF coil unit is placed at a position closely apart from the object in the Y axis direction.

* * * * *